United States Patent
Lee

(10) Patent No.: US 8,324,958 B2
(45) Date of Patent: Dec. 4, 2012

(54) REDUNDANCY CIRCUITS

(75) Inventor: Ki Hoon Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 158 days.

(21) Appl. No.: 12/844,454

(22) Filed: Jul. 27, 2010

(65) Prior Publication Data

US 2011/0241764 A1    Oct. 6, 2011

(30) Foreign Application Priority Data

Mar. 31, 2010    (KR) .................. 10-2010-0029098

(51) Int. Cl.
*H03K 19/003* (2006.01)
*H01H 37/76* (2006.01)

(52) U.S. Cl. ........................ 327/525; 365/200

(58) Field of Classification Search .................. 327/525, 327/526; 365/200, 194
See application file for complete search history.

(56) References Cited

U.S. PATENT DOCUMENTS

| | | | |
|---|---|---|---|
| 5,657,280 A * | 8/1997 | Shin et al. ................. | 365/200 |
| 6,570,804 B1 | 5/2003 | Blodgett | |
| 6,910,152 B2 * | 6/2005 | Blodgett ................... | 714/6.1 |
| 6,940,765 B2 * | 9/2005 | Kyung ...................... | 365/200 |
| 6,950,351 B2 | 9/2005 | Lim | |
| 6,977,851 B2 | 12/2005 | Noguchi | |
| 7,154,791 B2 * | 12/2006 | Kim ......................... | 365/200 |
| 7,379,357 B2 * | 5/2008 | Kang ....................... | 365/200 |
| 7,397,715 B2 | 7/2008 | Lim et al. | |
| 8,023,354 B2 | 9/2011 | Jeong | |

FOREIGN PATENT DOCUMENTS

| | | |
|---|---|---|
| JP | 08-077790 | 3/1996 |
| KR | 10-19990014031 A | 2/1999 |
| KR | 10-20050015721 A | 2/2005 |
| KR | 10-20070107886 A | 11/2007 |

* cited by examiner

*Primary Examiner* — Dinh T. Le

(74) *Attorney, Agent, or Firm* — William Park & Associates Ltd.

(57) ABSTRACT

In one embodiment, a redundancy circuit may include a comparison unit configured to record a first repair address through fuse cutting, compare a comparison address with the first repair address, and output a comparison result signal; a first fuse enable unit configured to output a first fuse enable signal for repairing the first repair address; a second fuse enable unit configured to output a second fuse enable signal for repairing a second repair address; a first determination unit configured to output a first repair determination signal in response to receipt of the first fuse enable signal and the comparison result signal; and a second determination unit configured to output a second repair determination signal in response to receipt of an inverted signal of a value of the comparison result signal corresponding to the certain bit, remaining bits, and the second fuse enable signal.

11 Claims, 4 Drawing Sheets

REDUNDANCY CIRCUITS

CROSS-REFERENCES TO RELATED APPLICATION

The present application claims priority under 35 U.S.C. §119(a) to Korean Application No. 10-2010-0029098, filed on Mar. 31, 2010, in the Korean Intellectual Property Office, which is incorporated herein by reference as if set forth in its entirety.

BACKGROUND

1. Technical Field

The present invention relates to semiconductor memory apparatuses, and more particularly, to semiconductor memory apparatus with redundancy circuits.

2. Related Art

When during the manufacturing of a semiconductor memory apparatus a failure occurs in at least one cell of the semiconductor memory apparatus (i.e., the cell cannot function as memory), the semiconductor memory apparatus may be sorted as a bad product. As a result of semiconductor memory apparatuses becoming increasingly integrated, the number of cells with defects arising during the manufacturing processes has increased. When an entire semiconductor memory apparatus is sorted as a bad product because of a failure of only a certain cell of the semiconductor memory apparatus, inefficiency results in terms of the manufacturing yield and the manufacturing cost. In order to use a semiconductor memory apparatus with one or more failed cells as a good product, extra cells for replacing the failed cells may be designed in advance. These extra cells are called redundancy cells. When making an input or an output to or from an address, it may be necessary to check whether the address is normal or failed and to determine whether an access is to be made to a basic cell or a replaced cell. Circuits for such checking and determination are called redundancy circuits. A process for converting the semiconductor memory apparatus with one or more failed cells into a good product is called a repair process.

In the case of a semiconductor memory apparatus, a redundancy circuit may be designed for each row of directional wiring lines and each column of directional wiring lines, and may include a fuse block for recording the address information of a failed cell. When an access is made to the failed cell, the replaced normal cell is accessed instead of the failed cell through the repair process by using the fuse block.

A fuse block of a redundancy circuit may include a plurality of fuse wiring lines. By conducting a fuse cutting process, in which a specified fuse among a plurality of fuses is cut using laser, the address information of a repaired cell may be recorded. In order to record the address information of the repaired cell, a plurality of fuses may be needed. In general, fuses may be provided for the respective bits of an address. For example, in order to record the repair information of an 11-bit address, at least 11 fuses may be needed.

In order to record one repaired address, one fuse block may be needed. Therefore, as the number of fuse blocks increases, an increased number of failed cells may be replaced, whereby an increased number of semiconductor memory apparatuses with failed cells may be converted into good products. Since an increased area is occupied as the number of fuse blocks increases, limitations exist in integrating an increased number of fuse blocks. Thus, the number of fuse blocks to be designed may be determined based on chip size and manufacturing yield.

In the existing fuse blocks, the information of one repaired address may be recorded in one fuse block. If the information of repaired addresses increases, the number of fuse blocks needed and the area occupied by the redundancy circuit also increase. This serves as a factor for impeding the miniaturization of semiconductor memory apparatuses.

FIG. 1 is a block diagram illustrating a conventional redundancy circuit used in semiconductor memory apparatuses. The redundancy circuit includes a comparison unit 100, a fuse enable unit 200, and a determination unit 300.

For example, the comparison unit 100 may record/store information of an 11-bit repaired address. The comparison unit 100 may be configured to receive an 11-bit comparison address RA<2:12> when an enable signal EN is inputted, compare the received 11-bit comparison address RA<2:12> with the information of the repaired address, and output an 11-bit comparison result signal HIT<2:12>.

The fuse enable unit 200 may be configured to output a fuse enable signal FSEN based on whether or not the information of the repaired address is recorded in the comparison unit 100, when the enable signal EN is inputted.

The determination unit 300 may be configured to receive the fuse enable signal FSEN and the 11-bit comparison result signal HIT<2:12>, and activate and output a repair determination signal HITB<0> when all of the fuse enable signal FSEN and the 11 bits of the comparison result signal HIT<2:12> are activated.

When the enable signal EN is inputted, the redundancy circuit may compare the comparison address RA<2:12> with the repaired address. The redundancy circuit may activate and output the repair determination signal HITB<0> when the comparison address RA<2:12> and the repaired address are the same. And the redundancy circuit may deactivate and output the repair determination signal HITB<0> when the comparison address RA<2:12> and the repaired address are different from each other. Therefore, whether the comparison address RA<2:12> corresponds to the repaired address may be determined based on the repair determination signal HITB<0>.

The redundancy circuit of FIG. 1 shows one fuse block in which one repaired address information may be recorded in the fuse block. For example, in the case where there are two repaired addresses which are similar to each other as in Table 1, two fuse blocks are needed. If the information of repaired addresses increases as described above, the number of needed fuse blocks needed also increases regardless of whether the addresses are similar or not. As a result, the fuse blocks may occupy an inefficiently increased area, which acts as a factor for impeding the miniaturization of semiconductor memory apparatuses.

TABLE 1

| | Address | | | | | | | | | | |
|---|---|---|---|---|---|---|---|---|---|---|---|
| | <2> | <3> | <4> | <5> | <6> | <7> | <8> | <9> | <10> | <11> | <12> |
| First Repaired Address | 0 | 1 | 1 | 1 | 1 | 1 | 1 | 1 | 1 | 1 | 1 |
| Second Repaired Address | 1 | 1 | 1 | 1 | 1 | 1 | 1 | 1 | 1 | 1 | 1 |

SUMMARY

In one exemplary embodiment, a redundancy circuit is provided including, for example: a comparison unit configured to record information of a first repair address through fuse cutting, receive a comparison address, compare the comparison address with the first repair address, and output a comparison result signal; a first fuse enable unit configured to output a first fuse enable signal for repairing the first repair address; a second fuse enable unit configured to output a second fuse enable signal for repairing a second repair address; a first determination unit configured to output a first repair determination signal in response to receipt of the first fuse enable signal and the comparison result signal; and a second determination unit configured to output a second repair determination signal in response to receipt of an inverted signal of a value of the comparison result signal corresponding to the certain bit, remaining bits of the comparison result signal, and the second fuse enable signal. A certain bit of the second repair address may be different from the corresponding bit of the first repair address.

In another exemplary embodiment, a redundancy circuit is provided, including, for example: a comparison unit storing information of a multi-bit repaired address, wherein the comparison unit is configured to compare a comparison address with the information of the multi-bit repaired address and output an address comparison result by multiple bits; a first determination unit configured to activate and output a first repair determination signal in response to receipt of the address comparison result when the address comparison result satisfies a first condition; and a second determination unit configured to activate and output a second repair determination signal in response to receipt of the address comparison result when the address comparison result satisfies a second condition different from the first condition.

BRIEF DESCRIPTION OF THE DRAWINGS

Features, aspects, and embodiments are described in conjunction with the attached drawings, in which.

DETAILED DESCRIPTION

Figure 1:
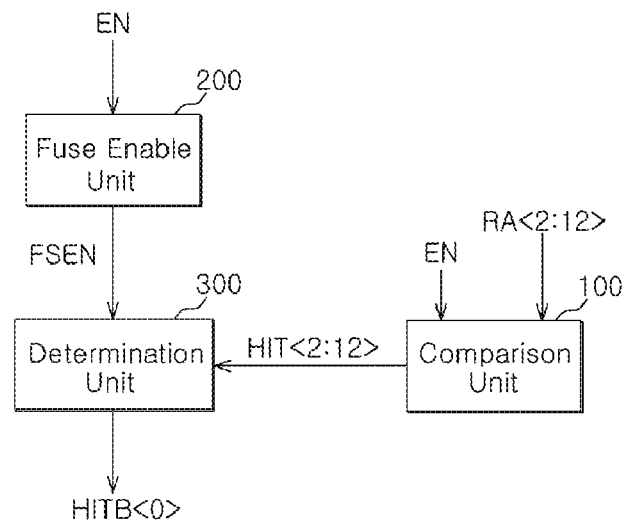
FIG. 1 is a block diagram illustrating a conventional redundancy circuit.

Reference will now be made in detail to the exemplary embodiments consistent with the present disclosure, examples of which are illustrated in the accompanying drawings. Whenever possible, the same reference numerals will be used throughout the drawings to refer to the same or like parts.

Figure 2:
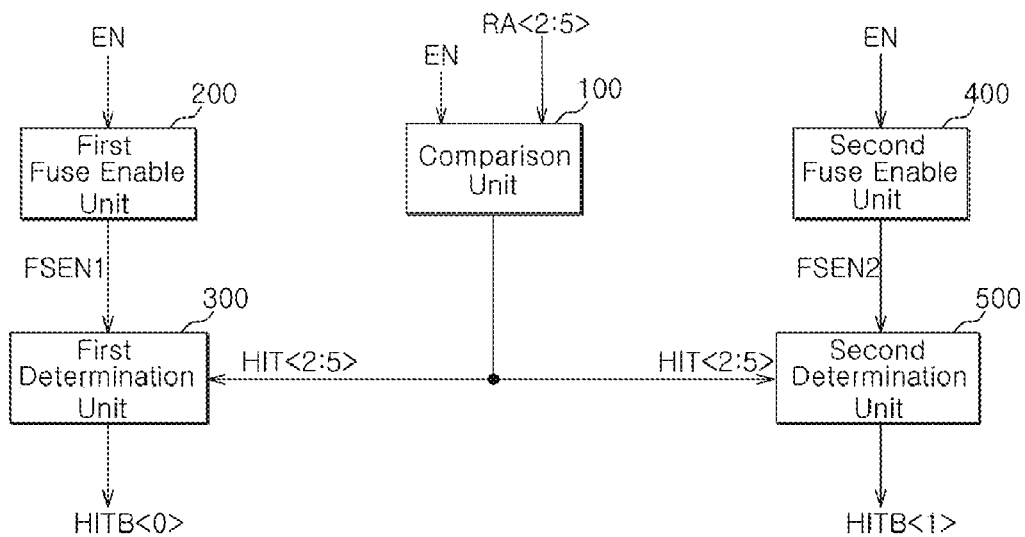
FIG. 2 is a block diagram illustrating a redundancy circuit in accordance with one embodiment of the invention.

FIG. 2 is a block diagram illustrating a redundancy circuit in accordance with an embodiment of the present invention. A redundancy circuit in accordance with an embodiment of the present invention may include a comparison unit 100, a first fuse enable unit 200, a first determination unit 300, a second fuse enable unit 400, and a second determination unit 500.

The comparison unit 100 may record/store information of a multi-bit first repair address through fuse cutting. For the sake of convenience in explanation, it is assumed that the information of the multi-bit first repair address is composed of 4 bits. The comparison unit 100 may be configured to receive a 4-bit comparison address RA<2:5> when an enable signal EN is inputted, compare the received 4-bit comparison address RA<2:5> with the information of the first repair address recorded therein through fuse cutting, and output a 4-bit comparison result signal HIT<2:5> to the first determination unit 300 and the second determination unit 500.

The first fuse enable unit 200 may be configured to output a first fuse enable signal FSEN1 based on whether the information of the first repair address may be recorded in the comparison unit 100 through fuse cutting, when the enable signal EN is inputted.

The first determination unit 300 may be configured to receive the first fuse enable signal FSEN1 and the multi-bit comparison result signal HIT<2:5>. The first determination unit 300 may be further configured to activate and output a first repair determination signal HITB<0> when all of the first fuse enable signal FSEN1 and the respective bits of the comparison result signal HIT<2:5> are activated. Also, the first determination unit 300 may be configured to deactivate and output the first repair determination signal HITB<0> when at least one of the first fuse enable signal FSEN1 and the respective bits of the comparison result signal HIT<2:5> is deactivated.

The second fuse enable unit 400 may store information regarding whether another address (hereafter, referred to as a second repair address), in which only a specified bit is different when compared to the 4-bit first repair address recorded in the comparison unit 100, is repaired. For the sake of convenience in explanation, it is assumed that only the most significant bit among the 4 bits of the second repair address is different from the 4-bit first repair address recorded in the comparison unit 100. The second fuse enable unit 400 may be configured to output a second fuse enable signal FSEN2 based on whether the second repair address is repaired, when the enable signal EN is inputted.

The second determination unit 500 may be configured to receive the second fuse enable signal FSEN2 and the 4-bit comparison result signal HIT<2:5>; invert the value of the most significant bit HIT<2> of the comparison result signal HIT<2:5>; execute a logical operation on the inverted value of the most significant bit HIT<2>, the remaining bits HIT<3:5>, and the second fuse enable signal FSEN2; and output a second repair determination signal HITB<1>.

In the redundancy circuit in FIG. 2, due to the fact that the first determination unit 300 and the second determination unit 500 share the comparison result signal HIT<2:5> outputted from the comparison unit 100, the information of the two repaired addresses may be handled using one redundancy circuit. In the conventional redundancy circuit shown in FIG. 1, in order to handle the information of two repaired addresses, two comparison units 100, two fuse enable units 200, and two determination units 300 are needed. In contrast, in the redundancy circuit in accordance with the embodiment of the invention shown in FIG. 2, in order to handle the information of two repaired addresses, one comparison unit 100, two fuse enable units 200 and 400, and two determination units 300 and 500 are needed. Since the area occupied by the comparison unit 100 is significantly larger than the area occupied by the first enable unit 200, the second fuse enable unit 400, the first determination unit 300, or the second determination unit 500, the omission of the area occupied by one comparison unit 100 has a great significance for miniaturization of a semiconductor memory apparatus.

Figure 3:
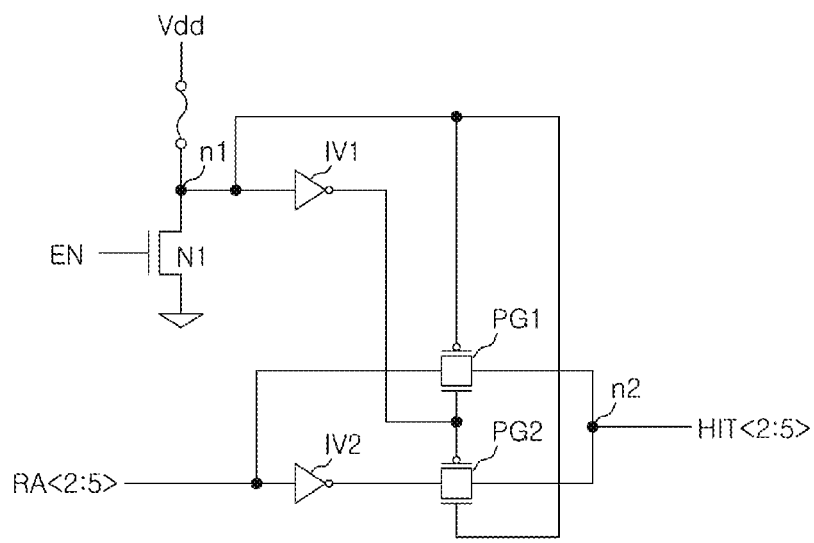
FIG. 3 is a detailed circuit diagram illustrating one exemplary embodiment of the comparison unit shown in FIG. 2.

FIG. 3 is a detailed circuit diagram illustrating an exemplary embodiment of the comparison unit 100 shown in FIG. 2.

Since the comparison unit 100 may receive one bit of the comparison address RA<2:5> and outputs one bit of the comparison result signal HIT<2:5>, the circuit shown in FIG. 3 should be provided for each bit. If the comparison address RA<2:5> and the comparison result signal HIT<2:5> are 4-bit signals as in the example above, the circuit shown in FIG. 3 should be provided four times. Therefore, because the circuit shown in FIG. 3 should be provided a number of times based on the number of the bits of the address, the comparison unit 100 occupies a larger area than the first enable unit 200, the second fuse enable unit 400, the first determination unit 300, or the second determination unit 500.

The comparison unit 100 may includes a fuse, a first NMOS transistor N1, a first inverter IV1, a second inverter IV2, a first pass gate PG1, and a second pass gate PG2. The fuse may be coupled between a first node n1 and a power supply voltage Vdd. The first NMOS transistor N1 may be turned on by the enable signal EN and may change the voltage level of the first node n1. The first inverter IV1 may invert the voltage level of the first node n1. The first inverter IV1 may output the inverted voltage level to the NMOS gate terminal of the first pass gate PG1 and the PMOS gate terminal of the second pass gate PG2. The first node n1 may be coupled to the PMOS gate terminal of the first pass gate PG1 and the NMOS gate terminal of the second pass gate PG2. The comparison address RA<2:5> may be applied to the input terminal of the first pass gate PG1 and to the input terminal of the second pass gate PG2 through the second inverter IV2. A second node n2 may be coupled to the output terminals of the first pass gate PG1 and the second pass gate PG. The second node n2 may output the comparison result signal HIT<2:5>.

The fuse may be cut based on the bit information of the repaired address during a repair process. The fuse cutting may record a bit of the first repair address. If the bit of the first repair address is "1", the fuse is cut. Conversely, if the bit of the first repair address is "0", the fuse is not cut. In an alternative embodiment, the fuse cutting scheme may be reversed in conformity with a design. If the enable signal EN is inputted, the voltage level of the first node n1 may be changed to a high level or a low level based on whether the fuse is cut or not. The corresponding bit of the comparison address RA<2: 5> may be outputted to the second node n2 through the first pass gate PG1 or through the second inverter IV2 and the second pass gate PG2 based on the voltage level of the first node n1. The signal outputted to the second node n2 may be the corresponding bit of the comparison result signal HIT<2: 5>. As a result of the comparison between each bit of the comparison address RA<2:5> and corresponding bit of the first repair address recorded through fuse cutting, if the bits are equal, the corresponding bit of the comparison result signal HIT<2:5> may be outputted as a high level, and if the bits are different, the corresponding bit of the comparison result signal HIT<2:5> may be outputted as a low level. If all of the respective bits of the inputted comparison address RA<2:5> and all of the respective bits of the first repair address recorded through fuse cutting are equal, all the 4 bits of the comparison result signal HIT<2:5> may be outputted as high levels. If at least one of the respective bits of the inputted comparison address RA<2:5> and at least one of the respective bits of the first repair address recorded through fuse cutting are different, each of the 4 bits of the comparison result signal HIT<2:5> may be outputted as a low level when two compared bits are different from each other and as a high level when two compared bits are the same with each other.

Based on the respective bits of the first repair address recorded in the comparison unit 100 through fuse cutting and the respective bits of the comparison address RA<2:5>, the respective bits of the comparison result signal. HIT<2:5> may be outputted as shown in Table 2.

TABLE 2

| Address | <2> | <3> | <4> | <5> |
|---|---|---|---|---|
| First Repair Address | 0 | 1 | 1 | 1 |
| RA<2:5> | 1 | 1 | 0 | 1 |
| HIT<2:5> | 0 | 1 | 0 | 1 |

In Table 2, the first repair address recorded through fuse cutting and the comparison address RA<2:5> have different values in address bits <2> and <4> and have the same values in address bits <3> and <5>. Accordingly, in this example, the comparison result signals HIT<2> and HIT<4> corresponding to the address bits <2> and <4> have the low level (i.e., the value of "0") and the comparison result signals HIT<3> and HIT<5> corresponding to the address bits <3> and <5> have the high level (i.e., the value of "1").

Figure 4:
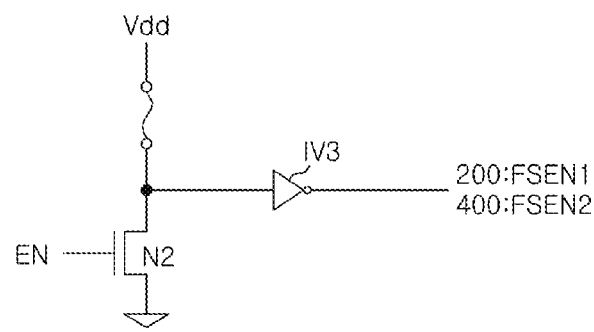
FIG. 4 is a detailed circuit diagram illustrating one exemplary embodiment of the first fuse enable unit and the second fuse enable unit shown in FIG. 2.

FIG. 4 is a detailed circuit diagram illustrating one exemplary embodiment of the first fuse enable unit 200 and the second fuse enable unit 400 shown in FIG. 2.

The first fuse enable unit 200 and the second fuse enable unit 400 may have the same configuration and output the first fuse enable signal FSEN1 and the second fuse enable signal FSEN2, respectively. Each one of the first fuse enable unit 200 and the second fuse enable unit 400 may include a fuse, a second NMOS transistor N2, and a third inverter IV3. The fuse may be coupled between the power supply voltage Vdd and the drain terminal of the second NMOS transistor N2. The second NMOS transistor N2 may have a gate terminal to which the enable signal EN may be applied and a source terminal which may be coupled to a ground terminal. The third inverter IV3 may be coupled to the drain terminal of the second NMOS transistor N2. The third inverter IV3 may be applied with the voltage of the drain terminal. And the third inverter IV3 may invert the voltage of the drain terminal and output the first fuse enable signal FSEN1 or the second fuse enable signal FSEN2. The fuse of the first fuse enable unit 200 may be cut when the information of the first repair address is recorded in the comparison unit 100 through fuse cutting.

When the enable signal EN is inputted, the first fuse enable unit 200 may output the first fuse enable signal FSEN1 to a high level or low level based on whether the fuse is cut or not. If the information of the repaired address is recorded in the comparison unit 100 and the fuse of the first fuse enable unit 200 is cut, the first fuse enable unit 200 may output the first fuse enable signal FSEN1 to the high level when the enable signal EN is inputted. Conversely, if the information of the repaired address is not recorded in the comparison unit 100 and the fuse of the first fuse enable unit 200 is not cut, the first fuse enable unit 200 may output the first fuse enable signal FSEN1 to the low level when the enable signal EN is inputted.

The fuse of the second fuse enable unit 400 may be cut when the second repair address is repaired.

When the enable signal EN is inputted, the second fuse enable unit 400 may output the second fuse enable signal FSEN2 to a high or low level based on whether the fuse is cut or not. If the second repair address is repaired and the fuse, of the second fuse enable unit 400 is cut, the second fuse enable unit 400 may output the second fuse enable signal FSEN2 to the high level when the enable signal EN is inputted. Conversely, if the second repair address is not repaired and the fuse of the second fuse enable unit 400 is not cut, the second fuse enable unit 400 may output the second fuse enable signal FSEN2 to the low level when the enable signal EN is inputted.

Two examples of cutting the fuses of the first fuse enable unit 200 and the second fuse enable unit 400 are provided below.

Upon repair of a first repair address <0111>: cutting of the fuse in the comparison unit 100 in conformity with each bit of the first repair address <0111>→cutting of the fuse of the first fuse enable unit 200.

Upon additional repair of a second repair address <1111>: repairing of a second repair address <1111> in which only a most significant bit is different when compared to the first repair address <0111> recorded in the comparison unit 100→cutting of the fuse of the second fuse enable unit 400.

Figure 5:
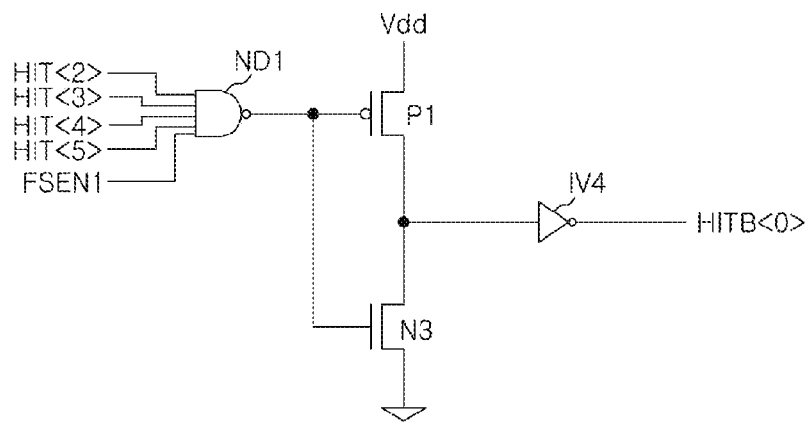
FIG. 5 is a detailed circuit diagram illustrating one exemplary embodiment of the first determination unit shown in FIG. 2.

FIG. 5 is a detailed circuit diagram illustrating an exemplary embodiment of the first determination unit 300 shown in FIG. 2. The first determination unit 300 may include a first NAND gate ND1, a first PMOS transistor P1, a third NMOS transistor N3, and a fourth inverter IV4. The first NAND gate ND1 serving as a 5 input NAND gate may receive and NAND the comparison result signal HIT<2:5> and the first fuse enable signal FSEN1. The first NAND gate ND1 serving as a 5 input NAND gate may output a signal. The signal outputted from the first NAND gate ND1 may be inputted to the gate terminals of the first PMOS transistor P1 and the third NMOS transistor N3. The first PMOS transistor P1 may have a source terminal to which the power supply voltage Vdd is coupled and a drain terminal to which the drain terminal of the third NMOS transistor N3 is coupled. The third NMOS transistor N3 may have a source terminal which is coupled to the ground terminal. The signals outputted from the first PMOS transistor P1 and the third NMOS transistor N3 may be outputted as the first repair determination signal HITB<0> through the fourth inverter IV4.

The first determination unit 300 may be configured to NAND the four bits of the comparison result signal HIT<2:5> received from the comparison unit 100 and the first fuse enable signal FSEN1 received from the first fuse enable unit 200. The first determination unit 300 may be further configured to output the first repair determination signal HITB<0> by activating it to a low level when all the five signals have high levels. Also, the first determination unit 300 may be configured to output the first repair determination signal HITB<0> by deactivating it to a high level when at least one of the five signals has a low level.

Figure 6:
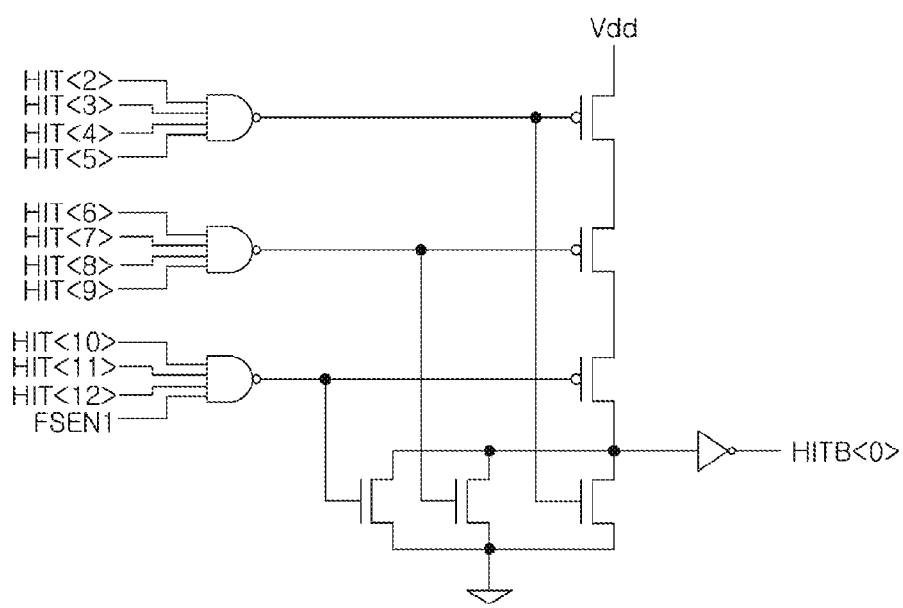
FIG. 6 is a detailed circuit diagram illustrating another exemplary embodiment of the first determination unit shown in FIG. 2.

FIG. 6 is a detailed circuit diagram illustrating another exemplary embodiment of the first determination unit 300 shown in FIG. 2. FIG. 6 represents a circuit diagram in a case where a comparison address to be inputted and compared with a repaired address recorded through fuse cutting is an 11-bit address RA<2:12> (not the 4-bit address RA<2:5> as in FIG. 5). When comparing FIG. 5 and FIG. 6, since input signals are increased from 5 in FIG. 5 to 12 in FIG. 6, the numbers of NAND gates, PMOS transistors, and NMOS transistors to be used in the first determination unit 300 also increase. As in FIG. 5, the first determination unit 300 in FIG. 6 may be configured to output the first repair determination signal HITB<0> by activating it to a low level when all the 12 inputted signals have high levels. Also, the first determination unit 300 may be configured to output the first repair determination signal HITB<0> by deactivating it to a high level when at least one of the 12 inputted signals has a low level.

Figure 7:
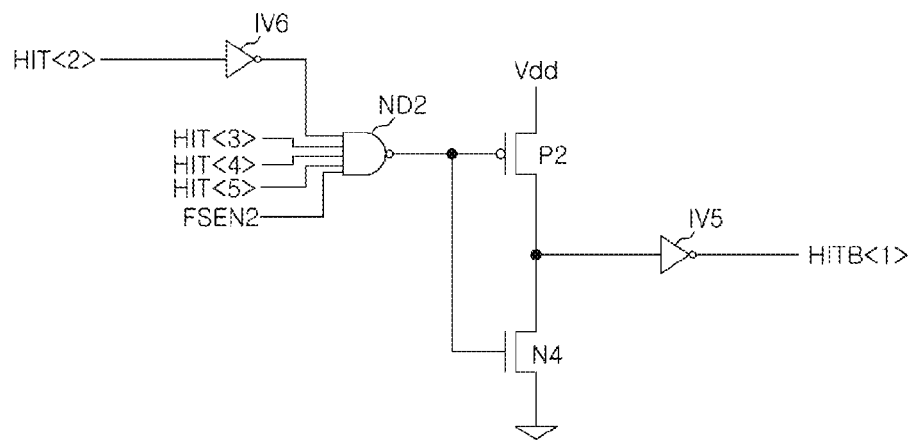
FIG. 7 is a detailed circuit diagram illustrating one exemplary embodiment of the second determination unit shown in FIG. 2.

FIG. 7 is a detailed circuit diagram illustrating one exemplary embodiment of the second determination unit 500 shown in FIG. 2. The second determination unit 500 may include a second NAND gate ND2, a second PMOS transistor P2, a fourth NMOS transistor N4, a fifth inverter IV5, and a sixth inverter IV6. The sixth inverter IV6 may receive and invert the most significant bit HIT<2> of the comparison result signal HIT<2:5>. The sixth inverter IV6 may further output the inverted value of the most significant bit HIT<2> to the second NAND gate ND2. The second NAND gate ND2 serving as a 5 input NAND gate may receive and NAND the inverted value of the most significant bit HIT<2>, the remaining bits HIT<3:5>, and the second fuse enable signal FSEN2. The second NAND gate ND2 serving as a 5 input NAND gate may further output a signal. The signal outputted from the second NAND gate ND2 may be inputted to the gate terminals of the second PMOS transistor P2 and the fourth NMOS transistor N4. The second PMOS transistor P2 may have a source terminal to which the power supply voltage Vdd is coupled and a drain terminal to which the drain terminal of the fourth NMOS transistor N4 is coupled. The fourth NMOS transistor N4 may have a source terminal that is coupled to the ground terminal. The signals outputted from the second PMOS transistor P2 and the fourth NMOS transistor N4 may be outputted as the second repair determination signal HITB<1> through the fifth inverter IV5.

The second determination unit 500 may invert, through the sixth inverter IV6, the value of the most significant bit HIT<2> among the 4 bits of the comparison result signal HIT<2:5> received from the comparison unit 100. The second determination unit 500 may further NAND the inverted value, the remaining bits HIT<3:5>, and the second fuse enable signal FSEN2 received from the second fuse enable unit 400. The second determination unit 500 may output the second repair determination signal HITB<1> by activating it to a low level when the value of the most significant bit HIT<2> has a low level, all the values of the remaining bits HIT<3:5> have high levels, and the second fuse enable signal FSEN2 has a high level. Also, the second determination unit 500 may output the second repair determination signal HITB<1> by deactivating it to a high level when the value of the most significant bit HIT<2> has a high level, at least one of the values of the remaining bits HIT<3:5> has a low level, or the second fuse enable signal FSEN2 has a low level.

Figure 8:
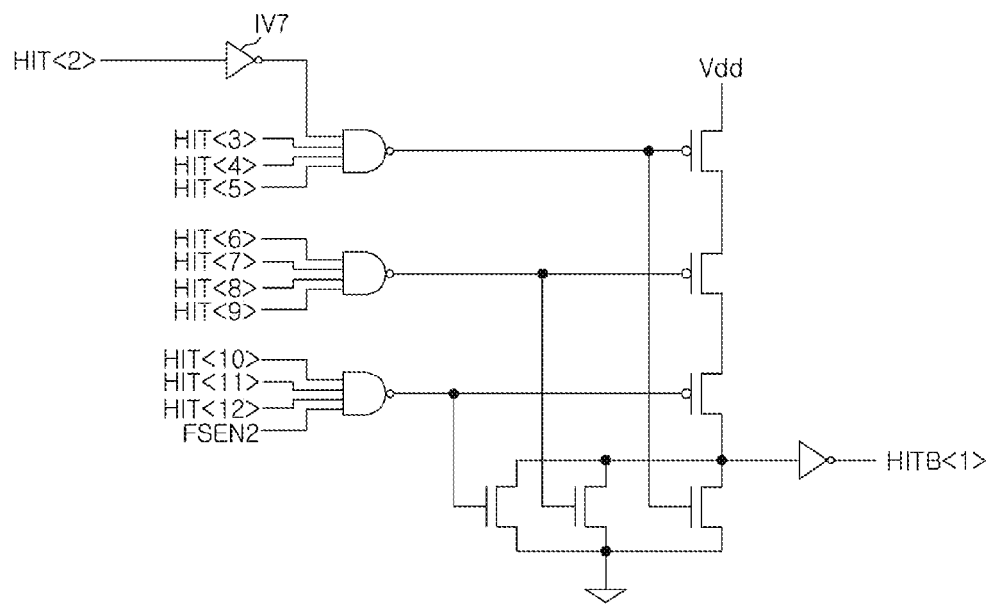
FIG. 8 is a detailed circuit diagram illustrating another exemplary embodiment of the second determination unit shown in FIG. 2.

FIG. 8 is a detailed circuit diagram illustrating another exemplary embodiment of the second determination unit 500 shown in FIG. 2. FIG. 8 represents a circuit diagram in the case where a comparison address to be inputted and compared with a repaired address recorded through fuse cutting is an 11-bit address RA<2:12> (not the 4-bit address RA<2:5> as in FIG. 7). When comparing FIG. 7 and FIG. 8, since input signals are increased from 5 in FIG. 7 to 12 in FIG. 8, the numbers of NAND gates, PMOS transistors and NMOS transistors to be used in the second determination unit 500 are increased.

The second determination unit 500 may inverts, through a seventh inverter IV7, the value of the most significant bit HIT<2> among the 11 bits of the comparison result signal HIT<2:12> received from the comparison unit 100. The second determination unit 500 may further NAND the inverted value, the remaining bits HIT<3:12>, and the second fuse enable signal FSEN2 received from the second fuse enable unit 400. And the second determination unit 500 may outputs the second repair determination signal HITB<1> by activating it to a low level when the value of the most significant bit HIT<2> has a low level, all the values of the remaining bits HIT<3:12> have high levels, and the second fuse enable signal FSEN2 has a high level. Also, the second determination unit 500 may output the second repair determination signal HITB<1> by deactivating it to a high level when the value of the most significant bit HIT<2> has a high level, at least one of the values of the remaining bits HIT<3:12> has a low level, or the second fuse enable signal FSEN2 has a low level.

An operation principle when an address is actually inputted to the fuse block shown in FIG. 2 is described below. The fuse block may contain the information of a certain 4-bit repaired address and another address in which only a most significant bit is different when compared to the 4-bit repaired address. For example, if an address <0111> and another address <1111> are repaired, the information of the address <0111> is recorded in the comparison unit 100 through fuse cutting, as a first repair address, during a repair process. In the example, only the most significant bit of the another address <1111> is different when compared to the address <0111>. Also, the fact that the information of the repaired address is recorded in the comparison unit 100 may be recorded in the first fuse enable unit 200 through fuse cutting. Further, the fact that the another address, that is, a second repair address, in which only the most significant bit is different when compared to the first repair address recorded in the comparison unit 100, is repaired may be recorded in the second fuse enable unit 400 through fuse cutting.

If the enable signal EN is inputted to check whether an address <0111> corresponds to the repaired address, the first fuse enable unit 200 may activate the first fuse enable signal FSEN1, and the second fuse enable unit 400 may activate the second fuse enable signal FSEN2. If the address <0111> is inputted as the comparison address RA<2:5>, the comparison unit 100 may output the comparison result signal HIT<2:5> as <1111>. Therefore, since all of the first fuse enable signal FSEN1 and the respective bits of the comparison result signal HIT<2:5> may be activated, the first determination unit 300 may activate and output the first repair determination signal HITB<0>. Also, since the most significant bit HIT<2> may be activated, the second determination unit 500 may deactivate and output the second repair determination signal HITB<1>. As the first repair determination signal HITB<0> is activated, a system may recognize that the address <0111> corresponds to the repaired address.

Moreover, if the enable signal EN is inputted to check whether an address <1111> corresponds to the repaired address, the first fuse enable unit 200 may activate the first fuse enable signal FSEN1, and the second fuse enable unit 400 may activate the second fuse enable signal FSEN2. If the address <1111> is inputted as the comparison address RA<2:5>, the comparison unit 100 may output the comparison result signal HIT<2:5> as <0111>. Therefore; since the most significant bit HIT<2> may be deactivated, the first determination unit 300 may deactivate and output the first repair determination signal HITB<0>. Also, since the second fuse enable signal FSEN2 may be activated, the remaining bits HIT<3:5> of the comparison result signal HIT<2:5> may be activated and the most significant bit HIT<2> may be deactivated, the second determination unit 500 may activate and output the second repair determination signal HITB<1>. As the second repair determination signal HITB<1> is activated, the system may recognize that the address <1111> corresponds to the repaired address.

Further, if the enable signal EN is inputted to check whether a non-repaired address <1101> corresponds to the repaired address, the first fuse enable unit 200 may activate the first fuse enable signal FSEN1, and the second fuse enable unit 400 may activate the second fuse enable signal FSEN2. If the address <1101> is inputted as the comparison address RA<2:5>, the comparison unit 100 may output the comparison result signal HIT<2:5> as <0101>. Therefore, since the most significant bit HIT<2> is deactivated and the bit HIT<4> is deactivated, the first determination unit 300 may deactivate and output the first repair determination signal HITB<0>. Also, since the bit HIT<4> is deactivated, the second determination unit 500 may deactivate and output the second repair determination signal HITB<1>. As both the first repair determination signal HITB<0> and the second repair determination signal HITB<1> are deactivated, the system may recognize that the address <1101> does not correspond to the repaired address. Whether the address <1101> is repaired may be checked through comparison by the other redundancy circuits. If it is confirmed through all the redundancy circuits that the address <1101> does not correspond to any one of the repaired addresses recorded in the respective redundancy circuits, the system may recognize the address <1101> as a non-repaired address, that is, a normal address.

As stated above, in the fuse block of the conventional redundancy circuit, the information of only one repaired address may be recorded. If there are two repaired similar addresses as given in FIG. 1, two fuse blocks are needed. If the information of repaired addresses increases as described above, the number of fuse blocks needed increases regardless of whether the addresses are similar or not, thereby increasing the area of the redundancy circuits. This acts as a factor for impeding the miniaturization of semiconductor memory apparatuses.

Unlike the conventional redundancy circuit in which one fuse enable unit 100 and one determination unit 300 monopolize one comparison unit 100 (see FIG. 1), in the redundancy circuit in accordance with an embodiment of the present invention, due to the fact that the two fuse enable units 200 and 400 and the two determination units 300 and 500 share the comparison result signal HIT<2:5> which is outputted from one comparison unit 100 (see FIG. 2), the information of the two repaired addresses may be handled in the fuse block with one comparison unit 100. Since the comparison unit 100, as shown in FIG. 4, is needed by the number of the respective bits of a repaired address, the sharing of one comparison unit 100 provides advantages for the miniaturization of semiconductor memory apparatuses.

The second determination units 500, shown in FIG. 7 and FIG. 8, may NAND the most significant bits of the comparison result signals HIT<2:5> and HIT<2:12> that have passed through the sixth inverter IV6 and the seventh inverter IV7, respectively, and may activate or deactivate and output the second repair determination signal HITB<1>. If it is assumed that another address, in which an $n^{th}$ significant bit is different when compared to the first repair address, is the second repair address, it is sufficient that the sixth inverter IV6 and the seventh inverter IV7 are designed to be disposed for corresponding bits HIT<n+1> of the comparison result signals HIT<2:5> and HIT<2:12>.

The comparison address RA<2:5> is exemplified as being used in row directional address repair or column directional address repair which is generally adopted when repairing a memory apparatus. While it was described that 4-bit comparison address is set as RA<2:5> for the sake of convenience in explanation, an optional multi-bit comparison signal may be used as the degree of integration of a semiconductor memory apparatus increases.

In the redundancy circuit in accordance with the embodiment of the present invention as shown in FIG. 2, in the case where the comparison result signal HIT<2:5> outputted from the comparison unit 100 satisfies the conditions preset in the first determination unit 300 and the second determination unit 500, the first repair determination signal HITB<0> and the second repair determination signal HITB<1> may be outputted by being activated. The redundancy circuit may include a comparison unit, a first determination unit, and a second determination unit. The comparison unit may have the information of a multi-bit repaired address. The comparison unit may be configured to receive a comparison address, compare the received comparison address with the information of the repaired address, and output the multi-bit comparison result signal HIT<2:5>. The first determination unit may be configured to receive the comparison result signal HIT<2:5> and activate and output the first repair determination signal HITB<0> when the comparison result signal HIT<2:5> satisfies a first condition. The second determination unit may be configured to receive the comparison result signal HIT<2:5> and activate and output the second repair determination signal HITB<1> when the comparison result signal HIT<2:5> satisfies a second condition different from the first condition. In FIG. 5, the circuit configured as the exemplary embodiment of the first determination unit 300 may include a NAND gate, execute a logical operation for the respective bits of the comparison result signal HIT<2:5>, and activate and output the first repair determination signal HITB<0> only when the comparison result signal HIT<2:5> corresponds to <1111>. Here, the first condition may be that the comparison result signal HIT<2:5> corresponds to <1111>. In FIG. 7, the circuit configured as the exemplary embodiment of the second determination unit 500 may include an inverter and a NAND gate, execute a logical operation by inverting or not inverting the respective bits of the comparison result signal HIT<2:5>, and activate and output the second repair determination signal HITB<1> only when the comparison result signal HIT<2:5> corresponds to <0111>. Here, the second condition may be that the comparison result signal HIT<2:5> corresponds to <0111>.

While certain embodiments have been described above with reference to illustrative examples for particular applications, it will be understood to those skilled in the art that the embodiments described are by way of example only. Those skilled in the art with access to the teachings provided in this disclosure will recognize additional modifications, applications, and/or embodiments and additional fields in which the present disclosure would be of significant utility. Accordingly, the redundancy circuit described herein should not be limited based on the described embodiments. Rather, the redundancy circuit described herein should only be limited in light of the claims that follow when taken in conjunction with the above description and accompanying drawings.

What is claimed is:

1. A redundancy circuit comprising:
a comparison unit configured to have a repair fuse, compare a signal according to a cutting result of the repair fuse with a comparison address, and output a comparison result signal;
a first fuse enable unit configured to have a first fuse and output a first fuse enable signal according to a cutting result of the first fuse;
a second fuse enable unit configured to have a second fuse and output a second fuse enable signal according to a cutting result of the second fuse;
a first determination unit configured to output a first repair determination signal in response to the first fuse enable signal and the comparison result signal; and
a second determination unit configured to output a second repair determination signal in response to the comparison result signal and the second fuse enable signal.

2. The redundancy circuit according to claim 1, wherein the comparison unit compares each bit of the comparison address and the cutting result of the first fuse.

3. The redundancy circuit according to claim 1, wherein the first fuse enable unit receives an enable signal, and, wherein the first fuse enable unit is configured to output the first fuse enable signal based on whether the first fuse is cut or not when the enable signal is inputted.

4. The redundancy circuit according to claim 1, wherein the second fuse is cut after the repair fuse is cut in the comparison unit.

5. The redundancy circuit according to claim 1, wherein the first determination unit outputs the first repair determination signal when all respective bits of the comparison result signal and the first fuse enable signal are activated.

6. The redundancy circuit according to claim 1, wherein the second determination unit outputs the second repair determination signal when the value of the comparison result signal corresponding to the certain bit is deactivated, all the remaining bits of the comparison result signal are activated, and the second fuse enable signal is activated.

7. A redundancy circuit comprising:
a comparison unit having a repair fuse which is cut according to information of a repaired address, wherein the comparison unit is configured to compare a comparison address with a signal according to a cutting result of the repair fuse and output an address comparison result;
a first determination unit configured to output a first repair determination signal in response to receipt of the address comparison result; and
a second determination unit configured to output a second repair determination signal in response to receipt of the address comparison result.

8. The redundancy circuit according to claim 7, wherein the comparison unit outputs the address comparison result by comparing each bit of the comparison address and the repaired address.

9. The redundancy circuit according to claim 1, wherein the cutting result of the first fuse is different from the cutting result of the second fuse.

10. The redundancy circuit according to claim 1, wherein the repair fuse, the first fuse and the second fuse are cut based on address information of a repaired cell.

11. The redundancy circuit according to claim 10, wherein the address information of the repaired cell includes multi bits, the bits of the address information which is provided to the repair fuse and the first fuse are different from that of the address information which is provided to the second fuse.

* * * * *